United States Patent
Liao

(10) Patent No.: US 9,088,084 B2
(45) Date of Patent: Jul. 21, 2015

(54) ELECTRICAL CONNECTOR HAVING CONTACT RETAINED THEREIN

(71) Applicant: HON HAI PRECISION INDUSTRY CO., LTD., New Taipei (TW)

(72) Inventor: Fang-Jwu Liao, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 2 days.

(21) Appl. No.: 14/140,583

(22) Filed: Dec. 26, 2013

(65) Prior Publication Data

US 2014/0179131 A1 Jun. 26, 2014

(30) Foreign Application Priority Data

Dec. 26, 2012 (TW) ............................. 101225142 A

(51) Int. Cl.
*H01R 12/00* (2006.01)
*H01R 13/41* (2006.01)
*H01R 12/57* (2011.01)
*H01R 13/24* (2006.01)
*H05K 3/34* (2006.01)

(52) U.S. Cl.
CPC ................ *H01R 13/41* (2013.01); *H01R 12/57* (2013.01); *H01R 13/2442* (2013.01); *H05K 3/341* (2013.01); *H05K 2201/10189* (2013.01)

(58) Field of Classification Search
CPC .... H01R 13/41; H01R 13/57; H01R 13/2442; H01R 12/71; H01R 12/716; H01R 12/57; H01R 12/714
USPC ............................................................ 439/83
See application file for complete search history.

(56) References Cited

U.S. PATENT DOCUMENTS

| | | | |
|---|---|---|---|
| 6,695,624 B1 * | 2/2004 | Szu | 439/66 |
| 7,322,829 B2 | 1/2008 | Ma | |
| 8,647,153 B2 * | 2/2014 | Ju et al. | 439/626 |
| 8,851,904 B2 * | 10/2014 | Chang et al. | 439/71 |
| 8,899,993 B2 * | 12/2014 | Taylor | 439/66 |

* cited by examiner

*Primary Examiner* — Jean F Duverne
(74) *Attorney, Agent, or Firm* — Wei Te Chung; Ming Chieh Chang

(57) ABSTRACT

An electrical connector includes an insulating housing and a plurality of contacts retained in the insulating housing. The insulating housing includes a top surface and bottom surfaces opposite to each other in an up-to-down direction and a plurality of receiving holes running through the top and bottom surfaces. A dimension from the top surface to the bottom surface in the up-to-down direction is defined as the height of the insulating housing, a plane on half the height of the insulating housing is defined as the center plane of the insulating housing. The contact engages the insulating housing forming an engaging area. A center line of the engaging area is parallel to the center plane of the insulating housing, and the distance between the center line of the engaging area and the center plane of the insulating housing is no more than 1/10 the height of the insulating housing.

12 Claims, 4 Drawing Sheets

US 9,088,084 B2

ELECTRICAL CONNECTOR HAVING CONTACT RETAINED THEREIN

BACKGROUND OF THE INVENTION

1. Field of the Invention

The present disclosure relates to an electrical connector, and more particularly to an electrical connector connecting an IC package with a substrate and being capable of decreasing a deformation of the electrical connector.

2. Description of the Related Art

Various electrical connectors are widely used in computer and other electronic devices. An electrical connector for electrically connecting a Central Processing Unit (CPU) to a Printed Circuit Board (PCB) typically comprises an insulating housing and a plurality of contacts retained therein. The contact essentially comprises a base portion, a contacting portion extending upwardly from the base portion for connecting the CPU and a soldering portion extending downwardly from the base portion for connecting the PCB. The base portion comprises a plurality of barbs at two opposite sides thereof for engaging the insulating housing. The insulating housing comprises a centre line in the middle of a top and bottom surfaces thereof. The barbs of the contact locate totally below the centre line. The retention force of the contact urges the lower half part of insulating housing to warp upwardly, especially during the soldering process, the warpage becomes more serious. Thus, the soldering portion of the contact may fail to connect the PCB and the electrical connection therebetween is unreliable.

In view of the above, an improved electrical connector is desired to overcome the problems mentioned above.

SUMMARY OF THE INVENTION

Accordingly, an object of the present disclosure is to provide an electrical connector being capable of decreasing the warpage of the insulating housing.

In order to achieve the object set forth, an electrical connector comprising an insulating housing and a plurality of contacts retained therein is provided. The insulating housing comprises a top surface and a bottom surface opposite to each other in an up-to-down direction and a plurality of receiving holes running through the top and bottom surfaces. The dimension from the top surface to the bottom surface in the up-to-down direction is defined as the height of the insulating housing, a plane on half the height of the insulating housing is defined as the centre plane of the insulating housing. The contact engages the insulating housing forming an engaging area. A centre line of the engaging area is parallel to the centre plane of the insulating housing, and the distance between the centre line of the engaging area and the centre plane of the insulating housing is no more than 1/10 the height of the insulating housing.

DESCRIPTION OF PREFERRED EMBODIMENT

Reference will now be made to the drawings to describe the present disclosure in detail.

Referring to FIGS. 1 to 4, an electrical connector 100 for electrically connecting a CPU with a PCB is provided. The electrical connector 100 comprises an insulating housing 1, a plurality of contacts 2 retained in the insulating housing 1 and a plurality of solder balls 3 corresponding to the contacts 2.

Figure 3:
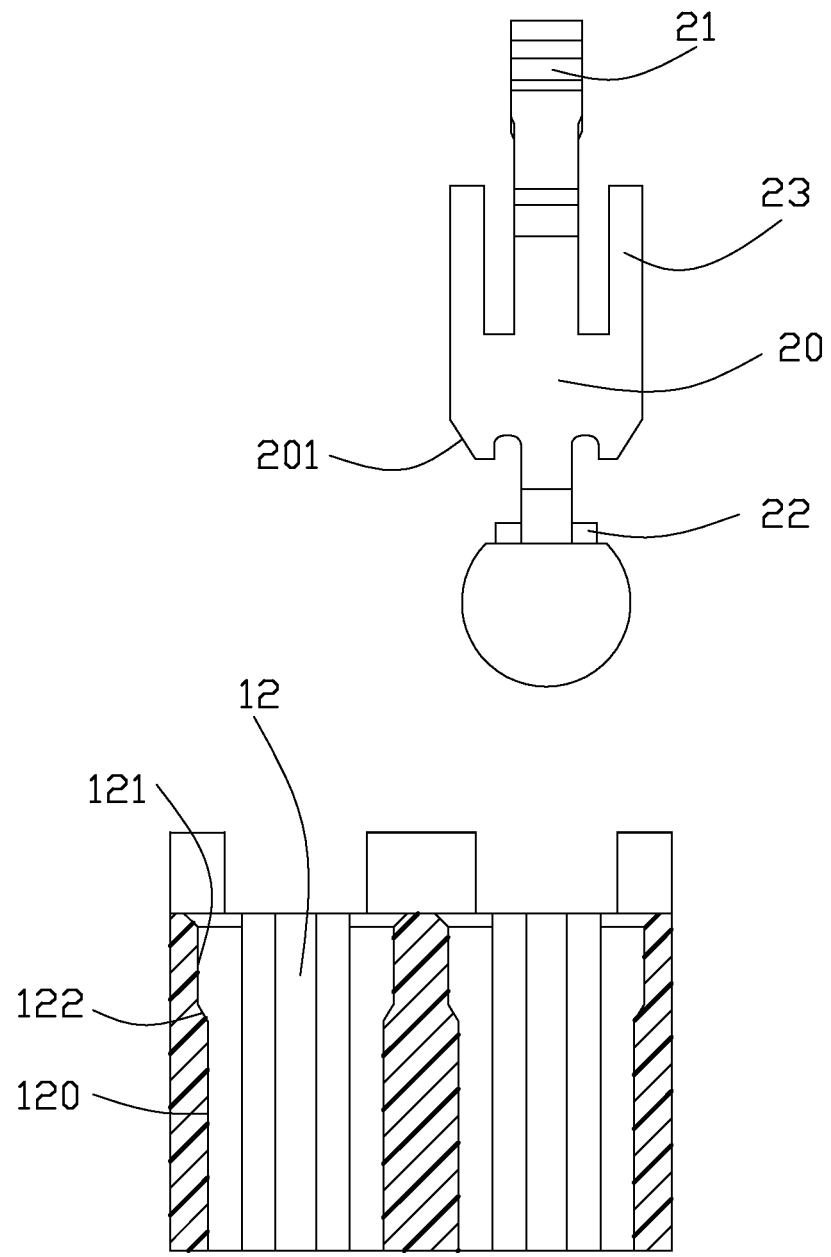
FIG. 3 is an exploded, cross-sectional view of the electrical connector shown in FIG. 1.
Figure 4:
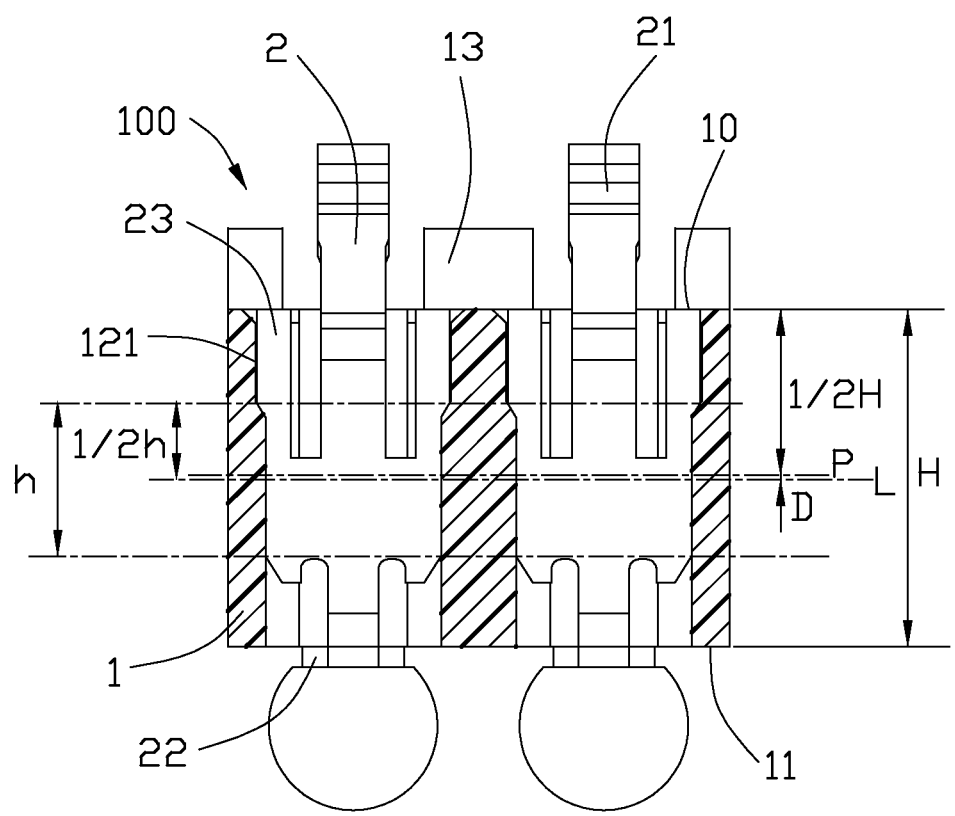
FIG. 4 is a cross-sectional view of the electrical connector shown in FIG. 1 along line IV-IV.

Referring to FIG. 3 and FIG. 4, the insulating housing 1 comprises a top surface 10, a bottom surface 11 opposite to the top surface 10 in an up-to-down direction and a plurality of receiving holes 12 running through the top and bottom surfaces 10, 11. The dimension between the top surface 10 and the bottom surface 11 in the up-to-down direction is defined as the height H of the insulating housing 1. A plane on half the height H of the insulating housing 1 is defined as a centre plane P. The insulating housing 1 comprises a plurality of embosses 13 extending upwardly from the top surface 10 of the insulating housing 1 and locating between two adjacent contacts 2 for supporting the CPU. The receiving hole 12 is a stepped hole comprising a broad section 121 extending downwardly from the top surface 10 towards the bottom surface 11, a narrow section 120 further extending downwardly and running through the bottom surface 11 and a tilted guiding section 122 connecting the broad section 121 and the narrow section 120. The receiving hole 12 on the broad section 121 is larger than that on the narrow section 120 in a horizontal direction perpendicular to the up-to-down direction. The guiding section 122 guides the contact 2 to be assembled into the receiving hole 12 in the up-to-down direction and engage the narrow section 120.

Figure 1:
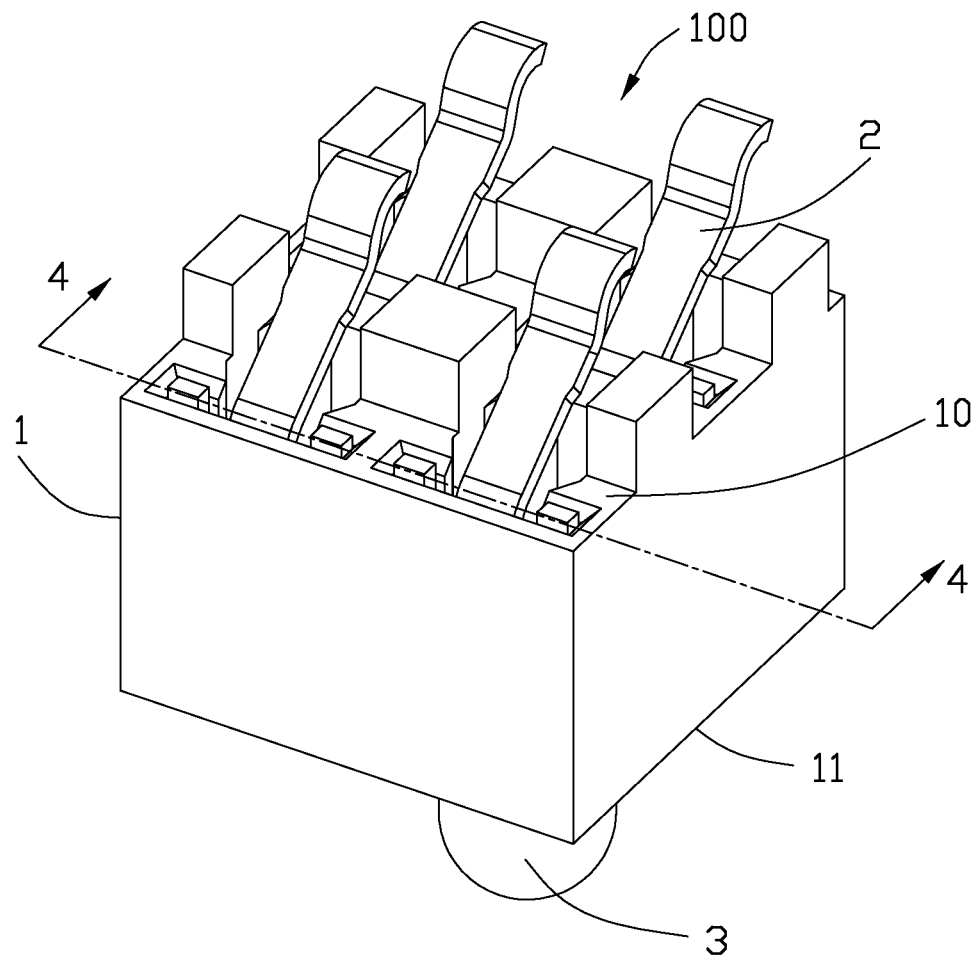
FIG. 1 is an assembled, perspective view of an electrical connector in accordance with a preferred embodiment of the present disclosure.
Figure 2:
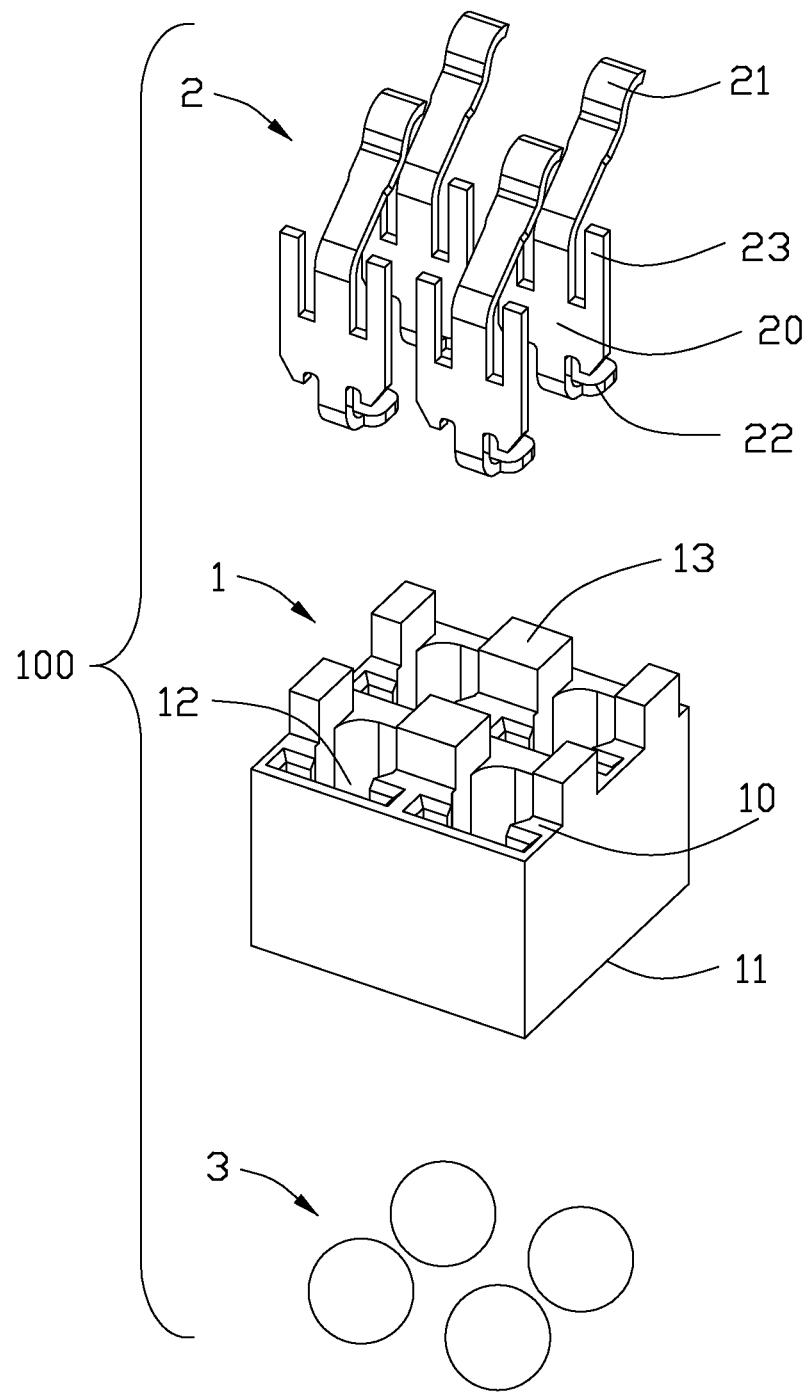
FIG. 2 is an exploded, perspective view of the electrical connector shown in FIG. 1.

Referring to FIG. 2 and FIG. 3, the contact 2 comprises a plate like base portion 20 defining an upper edge and a lower edge opposite to each other, a pair of connecting portions 23 extending upwardly from two ends of the upper edge, a contacting arm 21 extending upwardly from a middle portion of the upper edge and a soldering portion 22 extending downwardly from the lower edge of the base portion 20. The pair of connecting portions 23 locates on two opposite sides of the contacting arm 21 symmetrically. The base portion 20 comprises a pair of chamfers 201 on two ends of the lower edge thereof.

Referring to FIG. 4, when assembling, the contact 2 is assembled into the receiving hole 12 in the up-to-down direction, the chamfer 201 contacts the guiding section 122 and guides the contact 2 to further downward move into the narrow section 120 to retain the contact 2 therein. The base portion 20 and partial connecting portion 23 engage the narrow section 120 forming an engaging area while other partial connecting portion 23 near to the top surface 10 locates in the broad section 121 and disengage the insulating housing 1. The contacting arm 21 extends beyond the top surface 10 for contacting the CPU while the soldering portion 22 extends beyond the bottom surface 11 for connecting the PCB. The dimension of the engaging area in the up-to-down direction is marked as h while the centre line of the engaging area is marked as L. The centre line L parallel to the centre plane P of the insulating housing 1 and the distance between the line L and the centre plane P in the up-to-down direction is marked as D. The distance D is no more than 1/10 the height H of the insulating housing 1. Especially, the distance D can be zero, that is, the centre line L locates within the centre plane P.

In the preferred embodiment of the present disclosure as described above, the engaging area is a continuous linear area, but obviously, in other embodiment, the engaging area can also be a discontinuous point area, and in that case, the dimension of the engaging area is defined as the top engaging point to the lowest engaging point.

Anyhow, according to the above described embodiments, an electrical connector comprising an insulating housing 1 and a contact 2 retained therein is provided. The contact 2 engages the insulating housing 1 defining an engaging area, the distance between the centre line of the engaging area and the centre plane of the insulating housing 1 is no more than 1/10 the height of the insulating housing 1. Due to the special relationship between the contact 2 and the insulating housing 1 said above, the warpage of the insulating housing 1 is decreased and the electrical connection quality of the electrical connector is improved.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for electrically connecting a central processing unit (CPU) to a printed circuit board (PCB), comprising:
    an insulating housing comprising a top surface, a bottom surface opposite to each other in an up-to-down direction and a plurality of receiving holes running through the top and bottom surfaces, the dimension from the top surface to the bottom surface in the up-to-down direction defined as the height of the insulating housing, a plane on half the height of the insulating housing defined as the centre plane of the insulating housing; and
    a plurality of contacts received in the receiving holes, the contact engaging the insulating housing forming an engaging area, the contact comprising a contacting arm extending above the engaging area for connecting the CPU and a soldering portion extending below the engaging area for soldering on the PCB, wherein;
    a centre line of the engaging area is parallel to the centre plane of the insulating housing, and the distance between the centre line of the engaging area and the centre plane of the insulating housing is not more than 1/10 the height of the insulating housing; wherein the receiving hole comprises a narrow section, the engaging area is formed by the contact engaging with the narrow section; wherein the receiving hole comprises a broad section above the narrow section, the contact disengages the broad section;
    wherein the receiving hole comprises a tilted guiding section connecting the broad section and the narrow section for guiding the contact to be assembled therein.

2. The electrical connector as claimed in claim 1, wherein the distance between the centre line of the engaging area and the centre plane of the insulating housing is zero, that is, the centre line locates within the centre plane.

3. The electrical connector as claimed in claim 1, wherein the contact comprises a plate like base portion defining opposite upper and lower edges and a pair of connecting portions extending upwardly from two opposite ends of the upper edge.

4. The electrical connector as claimed in claim 3, wherein the contacting arm extends upwardly from the middle portion of the upper edge of the base portion.

5. The electrical connector as claimed in claim 3, wherein the soldering portion extends downwardly from the middle portion of the lower edge of the base portion.

6. The electrical connector as claimed in claim 3, wherein the base portion comprises a pair of chamfers formed on two opposite ends of the lower edge.

7. The electrical connector as claimed in claim 1, wherein the insulating housing further comprises a plurality of embosses extending upwardly from the top surface.

8. An electrical connector comprising:
    an insulating housing comprising a top and bottom surfaces opposite to each other in an up-to-down direction and a plurality of receiving holes running through the top and bottom surfaces, the dimension from the top surface to the bottom surface in the up-to-down direction defined as the height of the insulating housing, a plane on half the height of the insulating housing defined as the centre plane of the insulating housing; and
    a plurality of contacts received in the receiving holes, the contact comprising a plate like base portion defining two sides opposite to each other in a horizontal direction perpendicular to the up-to-down direction, wherein;
    the contact engages the insulating housing and defines a top engaging point and a lowest engaging point, the area between the top engaging point and the lowest engaging point is defined as an engaging area, a centre line of the engaging area is parallel to the centre plane of the insulating housing, and the distance between the centre line of the engaging area and the centre plane of the insulating housing is not more than 1/10 the height of the insulating housing; wherein the receiving hole comprises a broad section and a narrow section, the dimension of the base portion is larger than the narrow section but smaller than the broad section in the horizontal direction; wherein the contact comprises a pair of connecting portions extending upwardly from two sides of the base portion, and wherein partial connecting portion engages the narrow section while other partial connecting portion locates in the broad section and disengages the insulating housing.

9. The electrical connector as claimed in claim 8, wherein the distance between the centre line of the engaging area and the centre plane of the insulating housing is zero, that is, the centre line locates within the centre plane.

10. The electrical connector as claimed in claim 8, wherein the engaging area is a continuous linear area.

11. An electrical connector comprising:
    an insulative housing defining a plurality of receiving holes extending therethrough in a vertical direction;
    a plurality of contacts disposed in the corresponding receiving holes, respectively, each of said contacts defining an upper contacting section for contacting an electronic package, a lower mounting section for mounting to a printed circuit board, and a middle connecting section between the upper contacting section and the lower mounting section for interfering with the corresponding area in the corresponding receiving hole, wherein
    each of said receiving holes defines an engaging area interfering with the connecting section of the corresponding contact in said vertical direction a center point of the engaging area in the vertical direction is distanced from a center horizontal plane of the housing in the vertical direction within a range of one tenth of a height of the housing; wherein the center point is higher than the center plane in the vertical direction; wherein the connecting section at a first position confronting an upper portion of the engaging area is more flexible than that at a second position confronting a lower portion of the engaging area.

12. The electrical connector as claimed in claim 11, wherein a dimension of the engaging area in the vertical direction is less than one half of a whole dimension of the housing in the vertical direction.

* * * * *